US006885952B1

(12) United States Patent
Hayes

(10) Patent No.: US 6,885,952 B1
(45) Date of Patent: Apr. 26, 2005

(54) SYSTEM AND METHOD FOR DETERMINING VOLTAGE LEVELS

(75) Inventor: Patrick H. Hayes, Mission Viejo, CA (US)

(73) Assignee: Universal Electronics Inc., Cypress, CA (US)

(*) Notice: Subject to any disclaimer, the term of this patent is extended or adjusted under 35 U.S.C. 154(b) by 75 days.

(21) Appl. No.: 10/410,033

(22) Filed: Apr. 9, 2003

(51) Int. Cl.[7] .............................................. G01R 19/00
(52) U.S. Cl. ............................ 702/64; 702/64; 702/57; 702/60; 702/104; 324/433; 324/713; 320/155; 714/724
(58) Field of Search .......................... 702/57, 60, 63–65, 702/104; 324/433, 713; 320/155; 714/724

(56) References Cited

U.S. PATENT DOCUMENTS

| | | | | |
|---|---|---|---|---|
| 4,951,171 A | * | 8/1990 | Tran et al. | ..................... 361/90 |
| 5,652,502 A | * | 7/1997 | van Phuoc et al. | ........... 702/63 |
| 5,701,068 A | | 12/1997 | Baer et al. | |
| 5,796,334 A | | 8/1998 | Chen et al. | |
| 6,091,227 A | * | 7/2000 | Beard | ......................... 320/132 |
| 6,348,798 B1 | | 2/2002 | Daw | |

OTHER PUBLICATIONS

Bowen et al., 'A Micro–controller Controlled Battery Fuel Gauge and Charger', 1994, IEEE Article, pp. 179–184.*
Li et al., 'A Micro–controller–Based Interface for Active Sensors', May 18–21, 1998, IEEE Article, pp. 138–142.*
Motorola, Inc., Micropower Undervoltage Sensing Circuits, 1996, Rev 0, pp. 1–8.

* cited by examiner

Primary Examiner—Marc S. Hoff
Assistant Examiner—Elias Desta
(74) Attorney, Agent, or Firm—Gary R. Jarosik

(57) ABSTRACT

A method for determining a power source voltage level of a power source in a system in which the power source is connected to a microcontroller. A charging circuit is in direct communication with a pin of the microcontroller and the power source voltage level is determined by charging the charging circuit using a constant voltage level and determining a time when the charging circuit attains a voltage level sufficient to transition the pin of the microcontroller from a state corresponding to a logic "0" to a state corresponding to a logic "1." The determined time and a predetermined relationship between the power source voltage level and an input port transition voltage value of the microcontroller is then used to determine the power source voltage level of the power source.

35 Claims, 4 Drawing Sheets

PRIOR ART

| Measured Time (mS) | Equivalent Voltage (Volts) |
|---|---|
| 43.6 | 5.6 |
| 30.2 | 5.4 |
| 24.7 | 5.2 |
| 21.2 | 5.0 |
| 18.6 | 4.8 |
| 16.5 | 4.6 |
| 14.8 | 4.4 |
| 13.3 | 4.2 |
| 12.0 | 4.0 |
|  |  |

SYSTEM AND METHOD FOR DETERMINING VOLTAGE LEVELS

BACKGROUND

The subject invention relates generally to a system and method for determining voltage levels and, more particularly, relates to a method for determining voltage levels in a system having a microcontroller.

In embedded microcontroller applications, the ability to determine an analog voltage level is sometimes necessary. Examples of determining an/analog voltage level include reading sensor values for pressure, temperature, position, etc., in control and user interface systems as well as determining supply voltage levels in battery operated devices, such as remote controls. The determining of supply voltage levels in battery operated devices may be required, by way of example, for estimation of remaining battery capacity to be used, for automatic adjustment of features such as backlighting intensity settings to compensate for declining battery voltage, etc.

Where the microcontroller in question is equipped with a built-in analog to digital converter, a comparator with a reference voltage, or similar capability, determination of voltage levels can be directly and easily accomplished. However, many inexpensive microcontrollers omit built-in analog to digital converters for reasons of cost saving (i.e., low-cost microcontrollers). In the case of low-cost microcontrollers, one method commonly used to approximate a voltage level is to measure the charging time of a capacitor connected to the voltage of interest through a series resistor. As it is well known, the time dependent voltage (V(t)) measured across the capacitor during the charging cycle in such an arrangement can be expressed as:

$$V(t) = V_0(1 - e^{-t/RC}) \quad (1)$$

Where:
t=time in seconds from start of charging;
Vo=supply voltage;
R=resistance value;
C=capacitance value; and
e=the natural log base (2.71828 . . . ).

Accordingly, if the time (t) taken to reach a predetermined voltage value (V') can be measured, the value of the voltage source (Vo) can be calculated (for a known RC) as:

$$V_0 = V'/(1 - e^{-t/RC}). \quad (2)$$

In the case of low-cost microcontrollers which support only digital inputs, this approach can be used by selecting the predetermined voltage value (V') to be the voltage level at which a digital input port pin of the low-cost microcontroller transitions from a logic "0" to a logic "1." Since the transition point between a logic "0" and a logic "1" is generally a known relative constant for a given microcontroller technology, connecting an input-enabled port pin to the capacitor and time stamping the point during the charging cycle when the input reading switches from a logic "0" to a logic "1" is all that is required. Prior Art FIG. 1 shows a typical circuit that may be used for this purpose. In the circuit illustrated in FIG. 1, in order to determine a voltage level (Vo), port pins P10 and P11 are first both set to the "output low" state (to fully discharge capacitor C1) and then, after an appropriate period of time, P11 is reversed to become a high impedance input port and allow charging of the capacitor to commence. The time (t) between switching P11 to input mode and its observed transition from a logic "0" to a logic "1" is measured and used to calculate the voltage (Vo) as described above.

Unfortunately, this approach cannot be used successfully in unregulated battery powered devices to determine the battery supply voltage level itself (or any other absolute voltage, for that matter). This is because the "0" to "1" logic transition point of an input port of a microcontroller is not an absolute value, but rather varies with the supply voltage Vdd. Specifically, the transition point Input High ($V_{IN\ HIGH}$) is most often expressed as a ratio of Vdd, usually in the range 0.5 Vdd to 0.7 Vdd. Therefore, it will be appreciated that for a battery-powered (non-regulated) device, the previously described approach is only capable of determining a second voltage level as a ratio of Vdd—it cannot be used to determine an absolute voltage level. While this ratiometric approach is adequate for implementation of technologies such as FSR navigation pads and the like, it is not suitable for applications where the absolute value of Vdd is required such as, for example, backlight brightness adjustment. In this regard, attempting to solve equations (1) or (2) above for battery voltage measurement by substituting Vdd for Vo and 0.7 Vdd for V' will quickly reveal that time (t) becomes a constant.

A further analog to digital voltage measuring device is disclosed in U.S. Pat. No. 6,348,798 wherein a voltage measuring circuit is used to measure a voltage level of an unknown voltage source. The measuring circuit includes a capacitor configured for storing a charge from the unknown voltage source and a switch, such as a transistor, is configured to discharge the capacitor after the capacitor has reached a known threshold voltage. A microcontroller controls the switch and measures the amount of time (t) required to charge the capacitor to the required threshold voltage. Undesirably, the disclosed circuit requires an external comparator, e.g., a Motorola MC33464H-27AT1 reset controller, which is used to determine when the threshold voltage is reached and to provide a state-change logic signal to the microcontroller to signify to the microcontroller the end of the measured time (t).

SUMMARY

In order to overcome the disadvantages associated with these known circuits for determining voltage levels, an improved system and method for determining voltage levels is described hereinafter. Generally, for determining a voltage level of a power source in a system in which the power source is connected to a microcontroller, a charging circuit is placed in direct communication with a pin of the microcontroller. The charging circuit is charged using a constant voltage level and the microcontroller determines a time when the charging circuit attains a voltage level sufficient to transition the pin of the microcontroller from a state corresponding to a logic "0" to a state corresponding to a logic "1." The determined time and a predetermined relationship between the power source voltage level and an input port voltage value of the low-cost microcontroller is then used to determine the power source voltage level of the power source.

The invention also contemplates a readable media, such as a memory device, having instructions for performing various of the steps described hereinafter that are useful in determining voltage levels. In this regard, the memory device may include, by way of example, a RAM, ROM, Smart Card, Disk Memory, etc. Furthermore, the memory device may be part of the microcontroller or may be separate but accessible to the microcontroller.

A better understanding of the objects, advantages, features, properties and relationships of the subject system and method will be obtained from the following detailed description and accompanying drawings which set forth illustrative embodiments which are indicative of the various ways in which the principles of the system and method may be employed.

BRIEF DESCRIPTION OF THE DRAWINGS

For a better understanding of the system and method for determining voltage levels, reference may be had to preferred embodiments shown in the following drawings in which.

DETAILED DESCRIPTION

Figure 1:
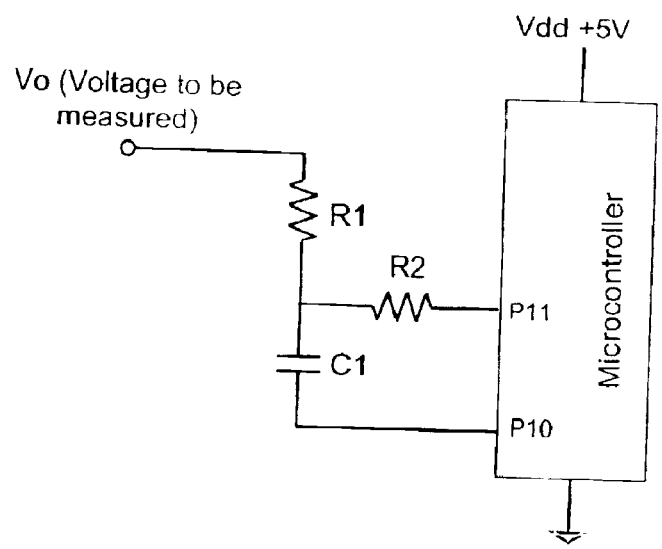
FIG. 1 illustrates a prior art circuit for use in measuring voltage levels.

With reference to the Figures, wherein like reference numerals refer to like elements, an exemplary system and method for determining voltage levels is hereinafter described. As will be appreciated, the exemplary system and method may be used in connection with any device having a power source that is desired to be monitored. By way of example only, devices may include hand-held electronic devices such as remote controls, PDAs, portable video games, and the like, lap-top computers, etc.

Figure 2:
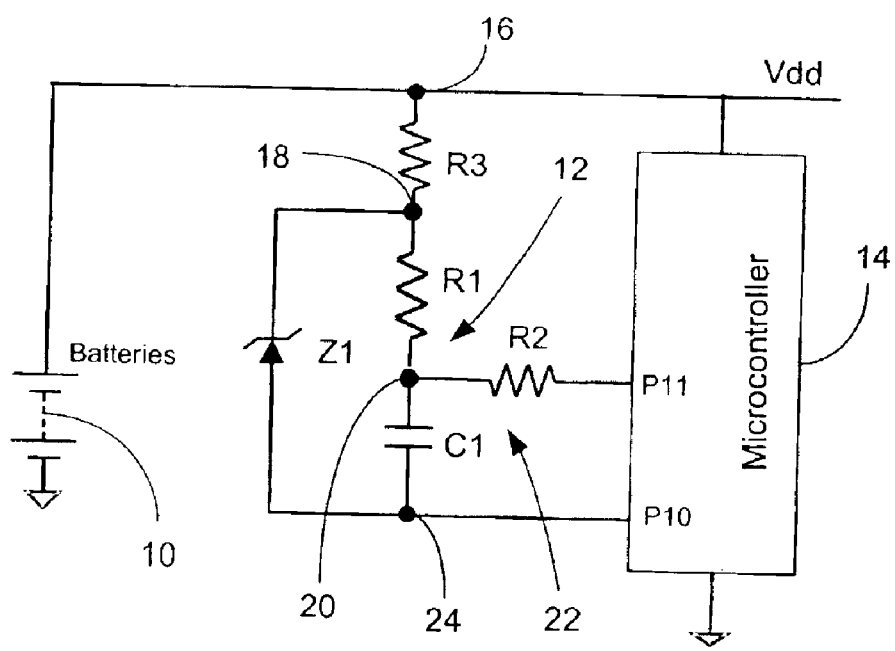
FIG. 2 illustrates an exemplary circuit for use in measuring voltage levels constructed in accordance with the principles of the subject invention.

More specifically, to measure voltage levels of a power supply, such as batteries 10 illustrated in FIG. 2, an exemplary voltage measuring circuit is provided that is designed to take advantage of the variable, Vcc dependent, nature of $V_{IN\ HIGH}$ of a microcontroller 14. To this end, the exemplary voltage measuring circuit is used to "invert" the conventional approach to RC based voltage measurement such that the voltage (Vo) used to charge a capacitor C1 is designed to be a constant voltage while the threshold voltage (V'), corresponding to the port pin's $V_{IN\ HIGH}$, is designed to be recognized as a variable voltage. In this manner, with a constant voltage (Vo), the charging curve V(t) of the capacitor is also a constant and, since the input port transition value $V_{IN\ HIGH}$ is known to be a percentage of the battery voltage level (Vdd), the absolute value of the battery voltage level (Vdd) can be derived from the measured time (t) based on the equation:

$$1-e^{-t/RC}=V(t)/Vo. \qquad (3)$$

With knowledge that the voltage (Vo) is constant and V(t) at time=T is a known fraction (x) of the battery voltage level (Vdd), a measured value of time (T) yields the battery voltage level (Vdd) as:

$$Vdd=V(T)/x=(1-e^{-T/RC})Vo/x. \qquad (4)$$

Alternatively, time (T) may be calculated for a given value of Vdd using the equation:

$$T=-ln(1-xVdd/Vo)*RC \qquad (5)$$

Figures 4, 5:
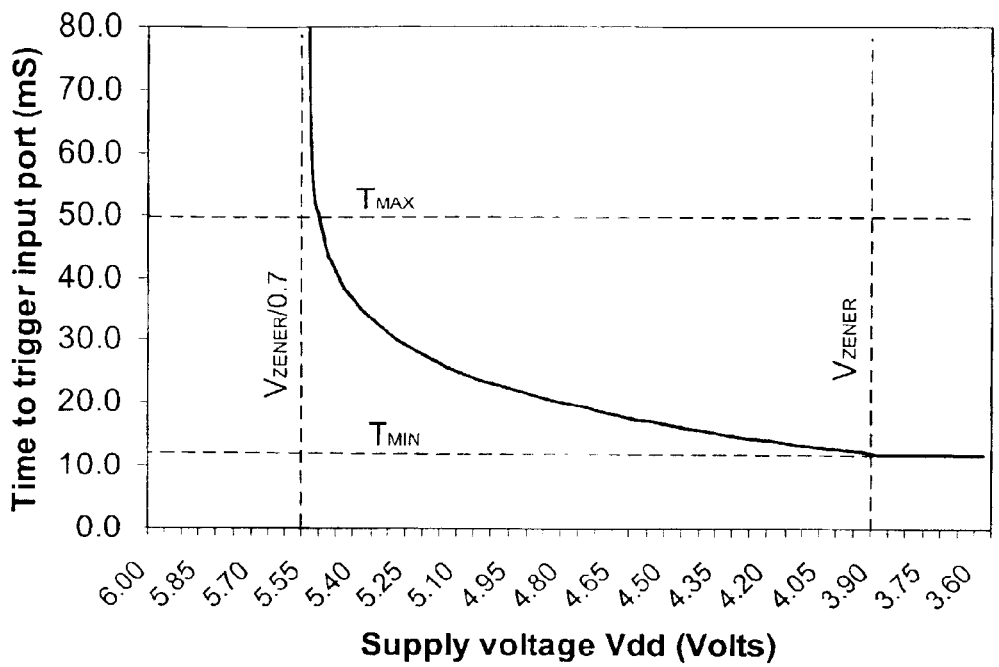
FIG. 4 illustrates a graph depicting an example of voltage measured as a function of time.
FIG. 5 illustrates an exemplary look-up table which functions to correlate measured time to a voltage.

For reasons that will become apparent, this latter equation (5) may then be used to create a look-up table, an example of which is illustrated in FIG. 5, that correlates voltage values for the battery (Vdd) with expected time values (T).

For use in maintaining the voltage (Vo) used to charge the capacitor C1 at a generally constant value, the exemplary voltage circuit may employ, for example, a Zener diode Z1. Specifically, an exemplary voltage measuring circuit provided for use in connection with microcontroller 14 may include a resistor R3 which is connected to the battery 10 at electrical junction 16. The resistor R3 may also be connected at electrical junction 18 to a charging circuit 12 comprised of a resistor R1 and a capacitor C1, the capacitor C1 being connected to resistor R1 at electrical junction 20. A resistor R2 connected at electrical junction 20 provides an electrical path from electrical junction 20 to pin P11 of microcontroller 14 while the capacitor C1 provides an electrical path from electrical junction 20 to pin P10 of microcontroller 14. The Zener diode Z1 may then be used to maintain the voltage (Vo) used to charge the capacitor C1 of the charging circuit 12 at a generally constant level by being placed between electrical junction 18 and pin. P10 of microcontroller 14. It is to be understood that other constant voltage sources may also be used in lieu of a Zener diode to charge the capacitor C1 such as, for example, several semiconductor devices of known forward, generally fixed voltage drop connected in series or any other electrical device that is capable of producing a generally fixed voltage reference.

By way of further example, using the equations set forth above, and assuming the component values for the circuit shown in FIG. 2 are such that R1=100 K ohm, R2=5 K ohm, R3=500 ohm, C1=0.1 uF, and Z1=3.9 Volts, a 6-volt nominal (4-battery) supply, and a Motorola standard specification $V_{IN\ HIGH}$=0.7 Vdd for microcontroller 14, the results, illustrated graphically in FIG. 4, could be used to generate a look-up table having the following values:

| Vdd | T (time to trigger) |
|---|---|
| 5.6 and above | Never |
| 5.5 | 43.6 mS |
| 5.0 | 22.8 mS |
| 4.5 | 16.5 mS |
| 4.0 | 12.7 mS |
| 3.9 and below | 12 mS |

It is to be noted that there is a "window" of measurement implicit in this approach, i.e., the highest battery voltage (Vdd) that can be measured is constrained by the fact that 0.7 Vdd cannot be greater than $V_{ZENER}$ (3.9 in this case), or else the logic state of the input port of microcontroller 14 will never transition, while the lowest measurable point is Vdd=$V_{ZENER}$ since, once this point is reached, the input voltage to the charging circuit 12 is no longer controlled and simply tracks Vdd downwards resulting in a constant time value. This windowing effect is further illustrated in FIG. 4. It will also be appreciated that this window may be adjusted up or down by varying the value of Z1. Still further, since the size of the window is dependent on the ratio of $V_{IN\ HIGH}$ to Vdd, lower ratios (e.g. 0.5 Vdd instead of 0.7 Vdd) will result in broader windows.

It will be additionally appreciated that other component values may also be used with equal success within the measuring circuit. In this regard, R1 and C1 of the charging circuit 12 may be selected to provide any conveniently measurable time constant appropriate to the timing capabilities of the microcontroller used. Similarly, since resistors P2 and R3 primarily serve to limit current flow through I/O ports P10 and P11 and zener diode Z1 to acceptable values during the charge and discharge cycles, their exact values are not critical to the measurement process as long as they are significantly lower than the value of resistor R1.

Figure 3:
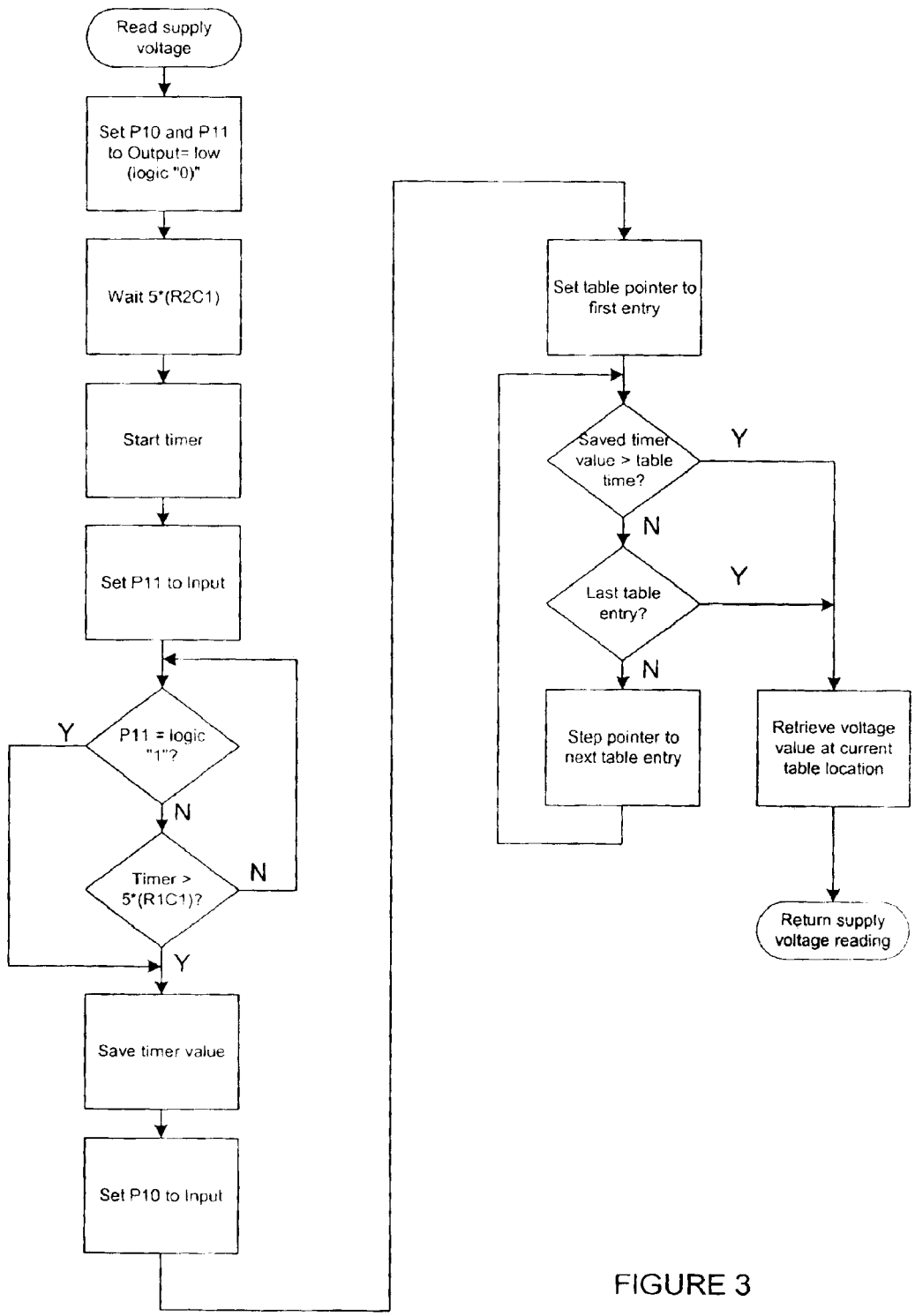
FIG. 3 illustrates a flow chart diagram of exemplary steps for measuring voltage levels utilizing the circuit illustrated in FIG. 2.

For use in determining a voltage level, exemplary method steps are illustrated in FIG. 3. In accordance with this exemplary method, to read the supply voltage level, I/O pins P10 and P11 of the microcontroller 14 are preferably placed into an output state corresponding to logic "0." Thereafter, a time period is provided to allow for the capacitor C1 to drain, e.g., at least five times the RC value of the discharge circuit 22 comprising R2 and C1, after which time the microcontroller 14 starts an internal timer to count time (t) while setting pin P11 to an input sensing state. As will be appreciated, at this time pin P11 will have an input state corresponding to logic "0." The microcontroller 14 then monitors the logic state of pin P11 until such time as the voltage level causes pin P11 to transition from the input state corresponding to logic "0" to an input state corresponding to logic "1."

To prevent the system from becoming locked as it waits for a transition, the timing operation may be stopped in the case where a predetermined time expires before a transition from the input state corresponding to logic "0" to the input state corresponding to logic "1" occurs, e.g., at least five times the RC value of the charging circuit 12 comprising R1 and C1. As noted previously, the expiration of this predetermined time would occur in cases where 0.7 Vdd is greater than $V_{ZENER}$. Once the timing operation has been stopped, owing to a transition or owing to a time-out, the value for the timer may be saved and pin P10 of the microcontroller 14 may be placed into an input state to stop any further, unnecessary current draw through the Zener diode Z1.

Once a time value has been measured, the value of Vdd can be calculated using equation (4) above or, if only a few steps in the range are sufficient for a given application, the value may be read from a look up table such as illustrated in FIG. 5, using techniques such as shown in the second part of the FIG. 3 flowchart. Note that the values in the table illustrated in FIG. 5 may actually correspond to the midpoints of ranges of time, e.g., the time opposite the 5.2 volt entry actually corresponds to an absolute voltage of 5.1, while the lime opposite the 5.4 volt entry actually corresponds to 5.3 volts. Following the logic in the flowchart, it will be seen that this results in any voltage in the range 5.1>Vdd>5.3 being reported as "5.2 volts."

While establishing Vdd within an approximate range of values may be adequate for many applications, in certain cases where a higher degree of accuracy is desired various measures may be taken to improve the accuracy of the voltage measurement. Besides simply increasing the number of steps in the look-up table, certain adjustment factors may be applied to the values obtained from the look-up table or calculated directly. For example, some microcontroller I/O port implementations may not be capable of fully reaching ground potential when set as "Output Low" but may, in reality, settle at a few tens or hundreds of millivolts above ground. In this case, it will be appreciated that an appropriate correction may be applied to the measured voltage values in order to compensate for this phenomenon (which would cause, for example, electrical junction 24 of the exemplary circuit of FIG. 2 to be slightly offset from true ground potential during the measurement process). This correction may take the form of constant value or may be proportional to the measured voltage, depending on the characteristics of the specific microcontroller used.

Additionally, since it is known that zener diodes may exhibit changes in nominal zener voltage at very low currents (i.e. as Vdd approaches $V_{ZENER}$), which changes are predictable and generally specified in manufacturer data sheets, adjustments may be made to the calculated look-up table values to compensate for the characteristic of the specific zener device used In other cases, where both a high degree of accuracy and the ability to use inexpensive components with wide tolerances is desired, it may be advantageous to perform a calibration procedure when a fresh set of batteries is installed by taking an initial measurement of the (presumed known) fresh battery Vdd and establishing a correction factor which may then be applied to all subsequent measurements. Such a calibration process may be user-initiated via, for example, entry into a set-up mode of operation as is well known in the art or, alternatively, may be performed automatically whenever it is sensed that batteries have been removed and re-installed into a device incorporating the subject system. In this latter instance, a user should be admonished to always install freshly-purchased batteries in any such device.

As a still further alternative, in instances when the microcontroller system is equipped with a non-volatile memory for storing set-up parameters, etc., the calibration process may be performed at the factory using a known voltage reference and the resulting correction factor permanently stored in the non-volatile memory.

From the foregoing, it will be appreciated that the disclosed exemplary voltage measuring circuit has the advantage of eliminating the need for the use of an external comparator. Furthermore, the exemplary voltage measuring circuit has the advantage of allowing an absolute voltage level to be determined. To this end, the exemplary circuit illustrated in FIG. 2 contrasts to the Prior Art circuit illustrated in FIG. 1 in that resistor R3 and zener diode Z1 function to provide a constant voltage source to a charging circuit 12 defined by resistor R1 and capacitor C1 while the microcontroller 14 input pin P11 changes logic state at a known fraction of Vdd.

While various concepts have been described in detail, it will be appreciated by those skilled in the art that various modifications and alternatives to those concepts could be developed in light of the overall teachings of the disclosure. As such, the particular concepts disclosed are meant to be illustrative only and not limiting as to the scope of the invention which is to be given the full breadth of the appended claims and any equivalents thereof.

What is claimed is:

1. A method for determining a power source voltage level of a power source in a system in which the power source is connected to a microcontroller, comprising:

charging a charging circuit in direct communication with a pin of the microcontroller using a constant voltage level;

determining a time when the charging circuit attains a voltage level sufficient to transition the pin of the microcontroller from a state corresponding to a logic "0" to a state corresponding to a logic "1;" and using the determined time and a predetermined relationship between the power source voltage level and an input port transition voltage value of the microcontroller to determine the power source voltage level of the power source.

2. The method as recited in claim 1, where a look-up table that provides a correspondence between the determined time and a voltage level is used to determine the power source voltage level.

3. The method as recited in claim 2, wherein the look-up table provides a correspondence between a range of determined times and an average voltage level within the range of determined times.

4. The method as recited in claim 1, wherein the charging circuit comprises an RC circuit.

5. The method as recited in claim 4, wherein the power source voltage level is determined using a relationship defined by an equation $Vdd=V(T)/x=(1-e^{-T/RC})Vo/x$.

6. The method as recited in claim 1, wherein the constant voltage level is provided using a resistor in electrical communication with the power supply and a Zener diode in electrical communication with the resistor and the charging circuit.

7. The method as recited in claim 1, wherein the step of determining a time comprises stopping a timer after a predetermined period of time has expired.

8. The method as recited in claim 1, wherein the charging circuit comprises an RC circuit and the step of determining a time comprises stopping a timer after a predetermined period of time has expired.

9. The method as recited in claim 8, wherein the predetermined time is at least five times the RC value of the charging circuit.

10. A system for determining a power source voltage level of a power source, comprising:
   a microcontroller electrically coupled to the power source; and
   a charging circuit in direct communication with a pin of the microcontroller which is charged using a constant voltage level;
   wherein the microcontroller is programmed to determine a time when the charging circuit attains a voltage level sufficient to transition the pin of the microcontroller from a state corresponding to a logic "0" to a state corresponding to a logic "1" and to use the determined time and a predetermined relationship between the power source voltage level and an input port transition voltage value of the microcontroller to determine the power source voltage level of the power source.

11. The system as recited in claim 10, where a look-up table that provides a correspondence between the determined time and a voltage level is used to determine the power source voltage level.

12. The system as recited in claim 11, wherein the look-up table provides a correspondence between a range of determined times and an average voltage level within the range of determined times.

13. The system as recited in claim 10, wherein the charging circuit comprises an RC circuit.

14. The system as recited in claim 13, wherein the power source voltage level is determined using a relationship defined by an equation $Vdd=V(T)/x=(1-e^{-T/RC})Vo/x$.

15. The system as recited in claim 10, wherein the constant voltage level is provided using a resistor in electrical communication with the power supply and a Zener diode in electrical communication with the resistor and the charging circuit.

16. The system as recited in claim 10, wherein the step of determining a time comprises stopping a timer after a predetermined period of time has expired.

17. The system as recited in claim 10, wherein the charging circuit comprises an RC circuit and the step of determining a time comprises stopping a timer after a predetermined period of time has expired.

18. The system as recited in claim 17, wherein the predetermined time is at least five times the RC value of the charging circuit.

19. A readable media having instructions for determining a power source voltage level of a power source in a system in which the power source is connected to a microcontroller, the instructions performing steps comprising:
   enabling a charging circuit in direct communication with a pin of the microcontroller to charge using a constant voltage level;
   determining a time when the charging circuit attains a voltage level sufficient to transition the pin of the microcontroller from a state corresponding to a logic "0" to a state corresponding to a logic "1;" and
   using the determined time and a predetermined relationship between the power source voltage level and an input port transition voltage value of the microcontroller to determine the power source voltage level of the power source.

20. The readable media as recited in claim 19, where a look-up table that provides a correspondence between the determined time and a voltage level is used to determine the power source voltage level.

21. The readable media as recited in claim 20, wherein the look-up table provides a correspondence between a range of determined times and an average voltage level within the range of determined times.

22. The readable media as recited in claim 19, wherein the charging circuit comprises an RC circuit.

23. The readable media as recited in claim 22, wherein the power source voltage level is determined using a relationship defined by an equation $Vdd=V(T)/x=(1-e^{-T/RC})Vo/x$.

24. The readable media as recited in claim 19, wherein the constant voltage level is provided using a resistor in electrical communication with the power supply and a Zener diode in electrical communication with the resistor and the charging circuit.

25. The readable media as recited in claim 19, wherein the step of determining a time comprises stopping a timer after a predetermined period of time has expired.

26. The readable media as recited in claim 19, wherein the charging circuit comprises an RC circuit and the step of determining a time comprises stopping a timer after a predetermined period of time has expired.

27. The readable media as recited in claim 26, wherein the predetermined time is at least five times the RC value of the charging circuit.

28. The method as recited in claim 1, further comprising using an adjustment factor when determining the power source voltage level of the power source.

29. The system as recited in claim 10, further comprising using an adjustment factor when determining the power source voltage level of the power source.

30. The readable media as recited in claim 19, further comprising using an adjustment factor when determining the power source voltage level of the power source.

31. The readable media as recited in claim 30, wherein using an adjustment factor comprises taking into consideration a deviation from ground potential in pins of the microcontroller.

32. The readable media as recited in claim 30, wherein using an adjustment factor comprises taking into consideration a deviation in an electrical characteristic of a device used in connection with charging the charging circuit.

33. The readable media as recited in claim 30, wherein using an adjustment factor comprises taking an initial measurement at a time when the power supply has a known voltage and establishing a correction factor using the initial measurement.

34. The readable media as recited in claim 33, wherein taking an initial measurement is performed in response to a changing of the power supply.

35. The readable media as recited in claim 33, wherein the correction factor is stored on the readable media.

* * * * *